(12) United States Patent
Robert et al.

(10) Patent No.: US 8,390,745 B2
(45) Date of Patent: Mar. 5, 2013

(54) CHANNEL FILTER, IN PARTICULAR FOR A DIGITAL TELEVISION RECEIVER

(75) Inventors: Jean-Luc Robert, Betton (FR); Dominique Lo Hine Tong, Rennes (FR); Raafat Lababidi, Tripoli (LB)

(73) Assignee: Thomson Licensing, Boulogne-Billancourt (FR)

( * ) Notice: Subject to any disclaimer, the term of this patent is extended or adjusted under 35 U.S.C. 154(b) by 525 days.

(21) Appl. No.: 12/452,311

(22) PCT Filed: Jun. 24, 2008

(86) PCT No.: PCT/EP2008/058040
§ 371 (c)(1),
(2), (4) Date: Dec. 23, 2009

(87) PCT Pub. No.: WO2009/000841
PCT Pub. Date: Dec. 31, 2008

(65) Prior Publication Data
US 2010/0134700 A1 Jun. 3, 2010

(30) Foreign Application Priority Data
Jun. 28, 2007 (FR) .................................... 07 56107

(51) Int. Cl.
*H04N 5/50* (2006.01)

(52) U.S. Cl. .................................................... 348/732

(58) Field of Classification Search .................. 348/731, 348/732, 725, 726, 728, 733, 735, 607, 609, 348/618; 455/338–341, 188.1; 333/206, 333/166, 167, 176, 209
See application file for complete search history.

(56) References Cited

U.S. PATENT DOCUMENTS

| | | | | |
|---|---|---|---|---|
| 3,600,711 A * | 8/1971 | Gerlack | | 333/206 |
| 3,611,214 A | 10/1971 | Gerlack | | |
| 3,755,761 A * | 8/1973 | Hartmann | | 333/166 |
| 4,207,547 A * | 6/1980 | Buck | | 333/209 |
| 5,933,770 A * | 8/1999 | Heiter | | 455/307 |
| 5,943,147 A * | 8/1999 | Vanoli et al. | | 398/27 |
| 6,445,735 B1 * | 9/2002 | Whikehart | | 375/232 |
| 6,448,872 B2 * | 9/2002 | Rhodes et al. | | 333/167 |
| 6,483,618 B2 * | 11/2002 | Amin et al. | | 398/87 |
| 6,738,581 B2 * | 5/2004 | Handelman | | 398/79 |
| 6,847,662 B2 * | 1/2005 | Bouda et al. | | 372/20 |
| 6,933,986 B2 * | 8/2005 | Plonka | | 348/732 |
| 7,076,226 B2 * | 7/2006 | Bult et al. | | 455/252.1 |
| 7,257,142 B2 * | 8/2007 | Sochava et al. | | 372/50.1 |
| 7,323,955 B2 * | 1/2008 | Jachowski | | 333/204 |
| 7,376,093 B2 * | 5/2008 | Barabash et al. | | 370/277 |
| 8,013,690 B2 * | 9/2011 | Miyashiro | | 333/176 |
| 2003/0194165 A1 * | 10/2003 | Silberberg et al. | | 385/11 |
| 2011/0134986 A1 * | 6/2011 | Skull et al. | | 375/229 |

OTHER PUBLICATIONS

Search Report Dated October 21, 2008.

* cited by examiner

*Primary Examiner* — Paulos M Natnael
(74) *Attorney, Agent, or Firm* — Tutunjian & Bitetto, P.C.

(57) ABSTRACT

The channel filter includes at a least one basic bandpass filter centred on the frequency of the channel, in series with two cascade-connected reflective filters whose bandwidths are located either side of the basic bandpass filter encompassing the channels adjacent to the channel. A reflective filter can include a 90° directional coupler combined with a bandpass filter designed to ensure transfer matched to the load impedance of the coupler with the input of the bandpass filter connected to a directional coupler output port, the input of the directive filter being formed by input port of the coupler and the output of the directive filter being formed by a port recovering the bandpass filter reflection coefficient. The invention applies in particular to the implementation of the DVB-T and DVB-H standards aimed at receiving digital television programs from fixed or mobile multistandard terminals such as mobile telephones, PDAs or other multimedia receivers.

8 Claims, 4 Drawing Sheets

CHANNEL FILTER, IN PARTICULAR FOR A DIGITAL TELEVISION RECEIVER

Figure 1:
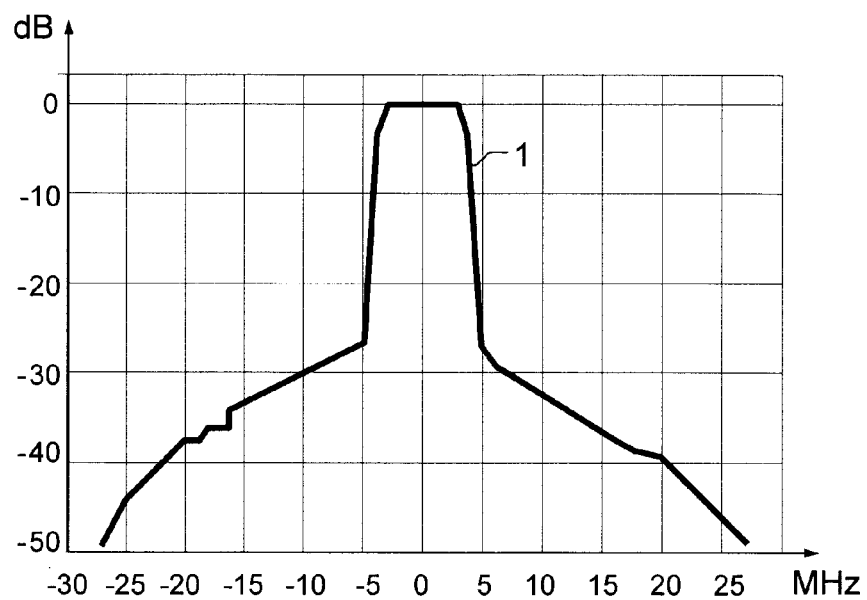

This application claims the benefit, under 35 U.S.C. §365 of International Application PCT/EP2008/058040, filed Jun. 24, 2008, which was published in accordance with PCT Article 21(2) on Dec. 31, 2008 in English and which claims the benefit of French patent applications No. 0756107, filed Jun. 28, 2007.

This invention concerns a channel filter. In particular, it applies as part of the implementation of the DVB-T and DVB-H standards designed to allow the reception of digital television programmes from fixed or mobile multistandard terminals such as mobile phones, PDAs or other multimedia receivers.

The main challenges of the DVB-T come partly from the particularly wide frequency bandwidth at the input of the receivers. This band extends in particular from 48 MHz to 862 MHz, encompassing the VHF, UHF and very probably L bands for DVB-H applications. This renders the RF input stages more complex. Challenges also come from the required performance in terms of the interference levels of channels adjacent to the reception channel. Indeed, to minimise modifications to the existing national network, it has been decided to simultaneously broadcast on DVB-T digital channels from the same geographical sites as analog broadcast transmissions and on adjacent frequency bands. This configuration is also valid in other European countries and has resulted in stringent specifications being imposed in terms of the immunity of digital receivers to analog or digital signals in the other channels.

For instance, if we consider one of the configurations used by the MBRAI standard for adjacent channels, we can see that the immunity required for channels immediately adjacent to a given channel is less than that required for more remote channels. In fact, this choice is linked with the limits of the current technology regarding filtering between channels. More particularly, most of the DTV reception circuits are still based on a heterodyne architecture with conversion of the reception frequency into an intermediate frequency, which is lower, followed by filtering by channel in the intermediate frequency by Surface Acoustic Wave or SAW filters. To make the most of the performance of these filters, conversion to a lower frequency, for instance around 36 MHz, is the method generally adopted The rejection or filtering level permissible with filters like this is around 35 to 40 dB outside the channel.

One purpose of the invention is more particularly increasing the rejection level between channels, especially when they are adjacent. To do this, one purpose of the invention is a channel filter characterised wherein it includes at a least one basic bandpass filter centred on the frequency of the channel, in series with two cascade-connected reflective filters whose bandwidths are located either side of the basic bandpass filter encompassing the channels adjacent to the channel.

In one embodiment, a reflective filter includes a 90° directional coupler loaded by a bandpass filter designed to ensure transfer matched to the load impedance of the coupler width of the input of the bandpass filter connected to a directional coupler output port, the input of the reflective filter being formed by the input port of the coupler and the output of the reflective filter being formed by a port recovering the bandpass filter reflection coefficient.

The output of the bandpass filter is, for instance, connected to an impedance equal to the load impedance while the other output of the coupler is connected to an impedance equal to the load impedance.

Because the channel is in order N, the bandpass of the first bandpass filter occupies, for instance, the bands of channels N−1 to N−3, being centred on the intermediate frequency of channel N−2, with the bandpass of the bandpass filter occupying the bands of channels N+1 to N+3, while being centred on the intermediate frequency of channel N+2.

For example, an amplifier is placed between the two reflective filters (50, 60) to compensate for the losses from these filters.

Advantageously, the bandpass filter is, for instance, a Tchebychev 5 pole type filter.

Because the filter is used in a digital television receiver, it includes, for instance, a microprocessor with an analog-digital converter to seek an optimum carrier-to-noise C/N ratio output by the DVB and demodulator of the receiver connected to the output of said filter with searching being carried out by adjusting alternately the poles of the bandpass filters.

Figure 2:
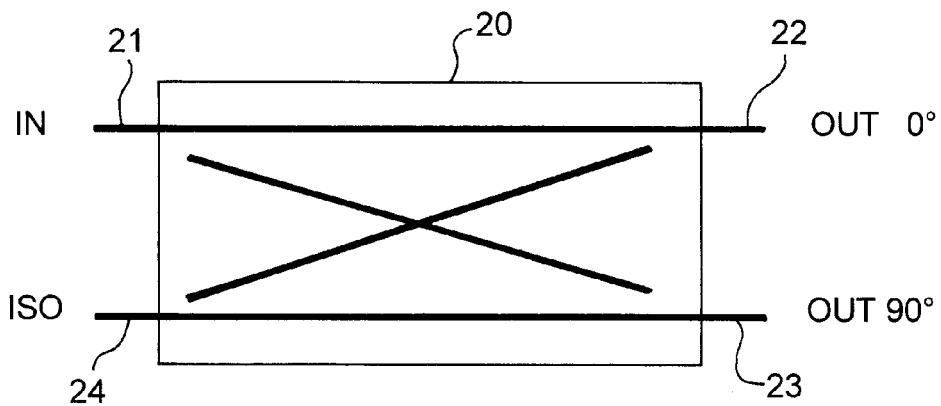
Figure 3:
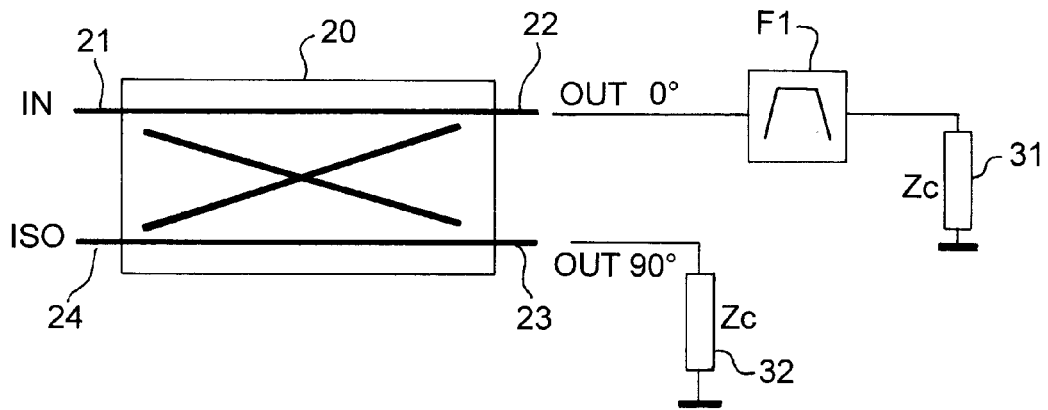
Figure 4:
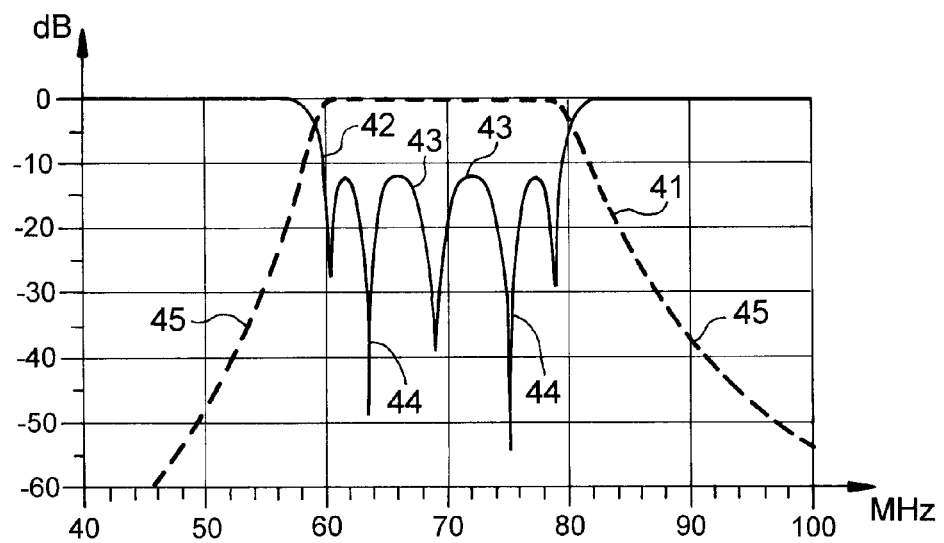
Figure 5:
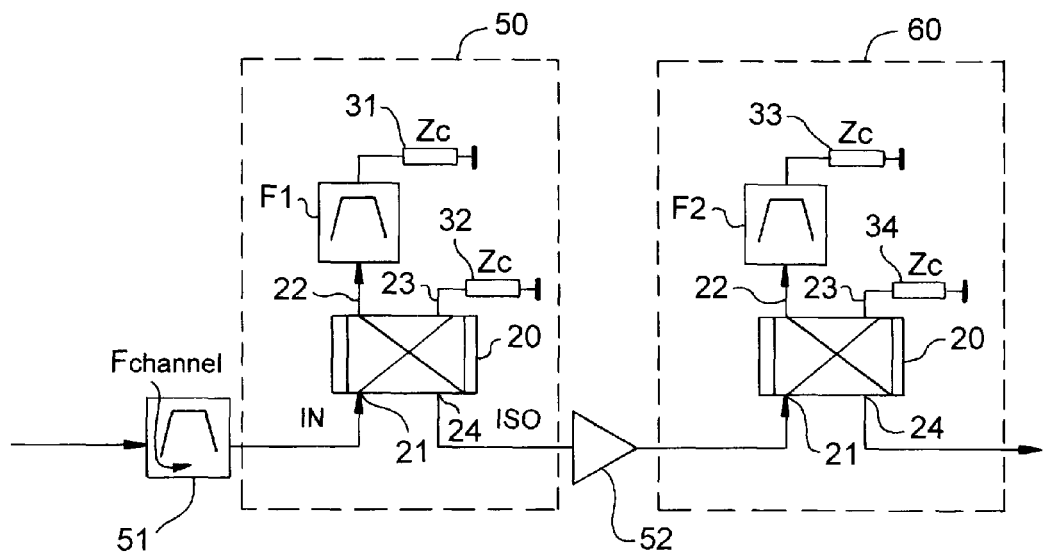
Figure 6:
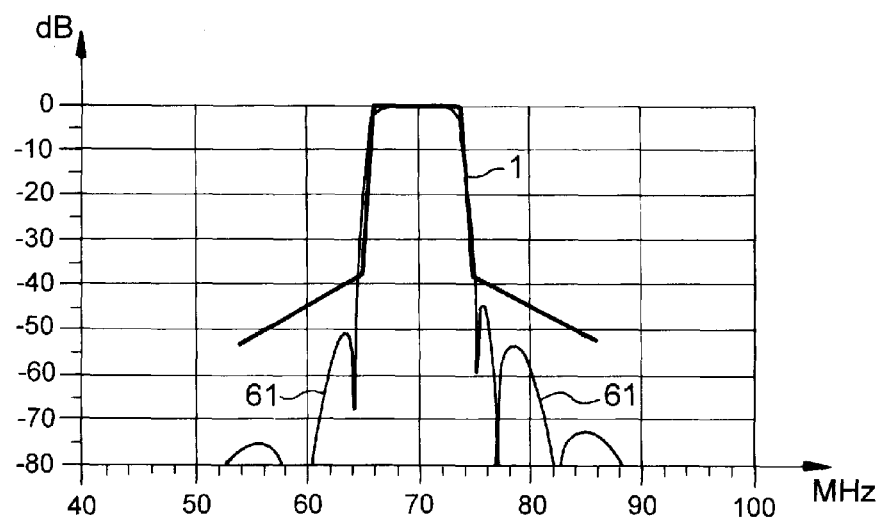
Figure 7:
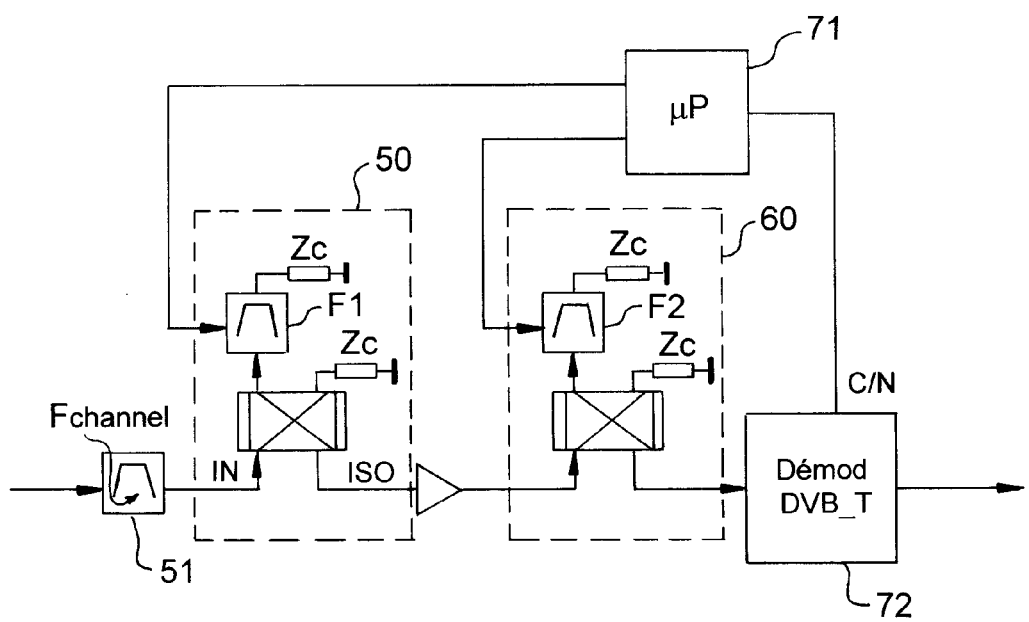

Other characteristics and advantages of the invention will appear in the description that follows with reference to the attached illustrations representing in:

FIG. 1, an illustration of a Surface Acoustic Wave type channel filter response;

FIG. 2, a presentation of a 90° directional coupler;

FIG. 3, a typical embodiment of a reflective filter using a 90° directional coupler;

FIG. 4, an illustration of the transmission and reflection responses of the previous filter;

FIG. 5, an example of an embodiment of the filter according to the invention;

FIG. 6, an example of the response of a filter according to the invention;

FIG. 7, another example of an embodiment of the filter according to the invention;

FIG. 1 presents an example of a Surface Acoustic Wave type channel filter response; The filter, represented by a bandpass type curve 1 is centred on the basic frequency $f_0$ of corresponding channel N, represented at frequency 0 on the abscissa axis of FIG. 1. The ordinates axis represents the attenuation of the filter according to the frequency.

Within the channel, attenuation is zero and quickly decreases at the limits of the corresponding frequency band, approximately ±4 MHz in the example of FIG. 1.

Curve 1 demonstrates in particular that for frequencies outside the channel but near the channel frequency band, for instance for frequencies included between ±4 and ±12 MHz, enclosing the adjacent channels N±1, attenuation is around 30 dB, which in practice is insufficient to ensure efficient filtering between adjacent channels. The invention described in the following is a way of modifying the filtering profile as illustrated in curve 1 of FIG. 1 to improve adjacent channel frequency filtering outside the channel. The attenuation level outside the channel can reach between 50 and 60 dB instead of the 30 dB of the filter in FIG. 1.

FIG. 2 illustrates a 90° directional coupler. A coupler 20 of this type can be used reflectively. Indeed, in this type of coupler transmission is from input port 21 to output ports 22, 23, with these two outputs phase shifted respectively by 90°. The energy is reflected towards a fourth port 24, generally referred to as ISO. In one use as a reflector, the input and output ports are respectively input port 21 and output port 24. Depending on the impedance appearing at output ports 22 and 23, ISO port 24 recovers the reflection coefficient of these outputs. Accordingly, if we connect a filter to one of output ports 22 and 23, designed to ensure impedance-matched transfer of coupler load Zc, ISO port 24 recovers the reflection coefficient of this circuit. This principle of reflection makes it possible to construct rejecting filters, also called "notch filters" or to obtain phase shifting or attenuation functions. Indeed, in this case, the ISO port forms the filter reflection response.

FIG. 3 illustrates an example of the embodiment of a reflective filter based on this principle of connection. A bandpass filter F1 having a transfer function H(p), is connected to the first port of output at 23 of coupler 20, with a zero phase-shift. Further, filter F1 is connected at the output to a load impedance 31 having a value Zc. The second port of output 23, phase shifted by 90°, is connected to another impedance 32 equal to load impedance Zc. If function H(p) is matched to the coupler load impedance Zc, the ISO port constitutes the reflection response of filter F1. By the transfer function H(p) modifying the characteristic impedance of the coupler output line, impedance Zc is chosen to adapt to this function H(p) so that the microwaves are reflected at this impedance.

FIG. 4 shows the components of parameter S of a bandpass filter represented by curves 41, 42 in a system of axes in which the abscissas represent the frequencies and the ordinates the attenuation in dB. More particularly, by a first curve 41 it shows response S(4,3) for bandpass filter transmission with a second curve 42 showing response S(3, 3) obtained by the reflection of the same filter. The curves of FIG. 4 reveal that reflection response 42, showing the poles 43 of the filter, has far steeper transition edges 44 than edges 45 of the transmission response.

FIG. 5, illustrates an example of an embodiment of the filter according to the invention; Two reflective filters 50, 60 of the type shown in FIG. 3, respectively equipped with a bandpass filter F1 and a bandpass filter F2, cascade connected to the existing channel N filter 51, a basic bandpass filter whose response is illustrated, for instance, in FIG. 1. The cascade connection is set up so that input port 21 of second reflective filter 60 is connected to the ISO output port 24 of the first filter. The bandwidths of the two filters F1 and F2 are located respectively either side of the central intermediate frequency of the channel N filter, for instance at 70 MHz. In this way, two filters are established enclosing a transmission zone with relatively steep edges. The bandwidths of filters F1, F2 are chosen to contain the adjacent channel frequencies. Accordingly, the bandpass of filter F1 occupies, for instance, the bands of channels N−1 to N−3, having a band width at least three times that of channel N and being centred on the intermediate frequency of channel N−2. Similarly, the band width of filter F2 takes up for instance the bands of channels N+1 to N+3, having a band width three times that of channel N and being centred on the intermediate frequency of channel N+2. Another band width can be adopted according to the desired performance.

An amplifier 52 is placed, for instance, between two reflective filters 50, 60 to compensate for the losses from these filters and ensure overall filtering without any losses. More specifically, amplifier 52 is connected in series between the output of filter 50 and the input of filter 60.

FIG. 6 illustrates the efficiency of a device according to the invention. More particularly, through a curve 61, it presents the response of filtering by a filter according to the invention compared to the response of a conventional channel filter alone 51, as illustrated by curve 1 presented in FIG. 1.

The response illustrated by curve 61 results from the cascade addition of two filters 50, 60 according to the set up of FIG. 5. This response 61 is more or less equal to response 1 of the channel filter alone then extends toward greater attenuation beyond −40 dB with steep edges demonstrating the efficiency of the new channel filter obtained by the set up of FIG. 5.

Filters F1, F2 can be produced from localised elements of the LC type. It is possible that the tolerances of these components influence the overall filtering efficiency. A filter structure of the Tchebychev 5 pole type can be used for instance for these filters F1, F2. In this case, a simultaneous variation of the capacities of the two "shunt" resonators of each filter produces a sufficient adjustment margin to centre the channel filter.

FIG. 7 presents an example of an embodiment compensating automatic only for the drifting of the overall filter. Each time the circuit is energised, a programme generated by a microprocessor 71 with an analogue-digital converter seeks an optimum of the carrier-to-noise C/N ratio supplied by a demodulator DVB 72 at the output of the overall filter, working alternately on the poles of filters F1 and F2. Silicon varactors are added, for instance, in parallel to the capacitors of the "shunt" resonators of filters F1, F2 to allow easy adjustment. The optimum value of the carrier-to-noise C/N ratio is found when the centring of the channel filter reaches optimum. Indeed, drifting at the centring of filters F1, F2 leads to the widening of the overall channel filter and/or the rising of the noise in the adjacent channels and accordingly a degradation of the carrier-to-noise C/N ratio.

A channel filtering device according to the invention, with respect of the implementation of DVB-T or DVB-H receivers, substantially improves the filtering of channels N±1 adjacent to a channel N.

The invention claimed is:

1. A channel filter comprising:
   at least one basic bandpass filter, centered on the frequency of channel N; and
   two cascade-connected reflective filters connected in series with the at least one basic bandpass filter and whose bandwidths are located either side of the frequency of channel N and encompass at least the frequencies of the channels of adjacent to channel N, wherein each reflective filter includes a 90° directional coupler loaded by a bandpass filter having a transfer function matched to a load impedance of the coupler.

2. The channel filter according to claim 1, wherein the input of each reflective filter corresponds to an input port of the 90° directional coupler and the output of each reflective filter being formed by a port recovering the bandpass filter reflection coefficient.

3. The channel filter according to claim 1, centered on the frequency of channel N, the bandwidth of a first bandpass filter occupying the bands of channels N−1 to N−3, while being centered on the intermediate frequency of channel N−2, with the bandwidth of the second bandpass filter occupying the bands of channels N+1 to N+3, while being centered on the intermediate frequency of channel N+2.

4. The channel filter according to claim 1 wherein an amplifier is placed between two reflective filters to compensate for losses due to these filters.

5. The channel filter according to claim 1 wherein the bandpass filters of the first and second reflective filters are of the Tchebychev 5pole types.

6. The channel filter according to claim 1 wherein the channel filter is used in a digital television receiver.

7. The channel filter according to claim 6, further comprising a microprocessor generating a program and being equipped with an analogue-digital converter to seek an optimum of the carrier-to-noise ratio supplied by DVB demodulator of the receiver connected to the output of said channel filter with searching carried out by working alternately on the poles of the bandpass filters of the first and second reflective filters.

8. The channel filter according to claim 1 wherein the basic bandpass filter is a Surface Acoustic Wave filter.

* * * * *